(12) United States Patent
Baba et al.

(10) Patent No.: US 12,150,246 B2
(45) Date of Patent: Nov. 19, 2024

(54) SENSOR DEVICE

(71) Applicant: DIC Corporation, Tokyo (JP)

(72) Inventors: Shunji Baba, Tokyo (JP); Hidefumi Nishi, Tokyo (JP)

(73) Assignee: DIC Corporation, Tokyo (JP)

(*) Notice: Subject to any disclaimer, the term of this patent is extended or adjusted under 35 U.S.C. 154(b) by 194 days.

(21) Appl. No.: 18/009,186

(22) PCT Filed: Jun. 10, 2021

(86) PCT No.: PCT/JP2021/022017
§ 371 (c)(1),
(2) Date: Dec. 8, 2022

(87) PCT Pub. No.: WO2021/261257
PCT Pub. Date: Dec. 30, 2021

(65) Prior Publication Data
US 2023/0262884 A1    Aug. 17, 2023

(30) Foreign Application Priority Data
Jun. 26, 2020 (JP) .................... 2020-110084

(51) Int. Cl.
*H05K 1/02* (2006.01)

(52) U.S. Cl.
CPC ......... *H05K 1/028* (2013.01); *H05K 2201/05* (2013.01); *H05K 2201/10037* (2013.01); *H05K 2201/10151* (2013.01)

(58) Field of Classification Search
CPC .............. H05K 1/028; H05K 2201/05; H05K 2201/10037; H05K 2201/10151
USPC .......................................................... 361/749
See application file for complete search history.

(56) References Cited

U.S. PATENT DOCUMENTS

| | | | |
|---|---|---|---|
| 2014/0076026 A1 | 3/2014 | Starling et al. | |
| 2015/0260673 A1 | 9/2015 | Seto | |
| 2016/0147263 A1* | 5/2016 | Choi | G06F 1/1616 361/679.3 |
| 2017/0299649 A1* | 10/2017 | Coyne | G01R 31/2879 |
| 2021/0041273 A1 | 2/2021 | Nishi | |
| 2021/0262863 A1 | 8/2021 | Nishi et al. | |

FOREIGN PATENT DOCUMENTS

| | | |
|---|---|---|
| JP | 2015-187603 A | 10/2015 |
| WO | 2019/155732 A1 | 8/2019 |
| WO | 2020/066366 A1 | 4/2020 |

* cited by examiner

*Primary Examiner* — Andargie M Aychillhum
(74) *Attorney, Agent, or Firm* — Osha Bergman Watanabe & Burton LLP (57) ABSTRACT

A sensor device in which flexibility is ensured over the entirety of the device and that can be manufactured at low costs is provided. The sensor device having flexibility includes a flexible substrate, a temperature/humidity sensor connected to the flexible substrate, and an exterior body formed of a soft material. The temperature/humidity sensor has a waterproof moisture-permeable material that covers a detection surface. The exterior body has an opening that exposes the waterproof moisture-permeable material. The flexible substrate is bonded at at least a peripheral part thereof to the exterior body.

8 Claims, 5 Drawing Sheets

SENSOR DEVICE

TECHNICAL FIELD

One or more embodiments of the present invention relate to a sensor device that has flexibility and that detects temperature and humidity.

BACKGROUND

There is a sensor device that senses temperature, humidity, illuminance, and the like and uses results of sensing to control an air conditioning apparatus in order to reduce energy consumption while maintaining comfortability in a building. By installing such a sensor device at a required place in a building and providing the sensor device with information required for optimal control of cooling, heating, ventilation, air-conditioning, and an illumination system, it is possible to use the sensor device to more efficiently control the amount of energy used in the building.

The housings of most of conventional sensor devices are formed of hard materials to protect the insides thereof. However, when such a sensor device is to be attached to a curved wall surface or the like, a member such as a spacer that compensates a curved part to ensure an attachment planar surface is required and increases time, labor, and costs for attachment.

Thus, for example, PTL 1 discloses a wireless sensor device that is attachable also to a curved surface. Such a wireless sensor device uses a flexible sheet as an exterior body to be attachable also to a curved surface and the like.

Exterior bodies of conventional sensor devices are provided with an opening for exposing a detection surface of a temperature/humidity sensor to external environment. Among such conventional sensor devices, sensor devices that are to be installed at outdoor locations exposed to rain and at washrooms and the like where there is a likelihood of water droplets spattering are required to have a waterproof structure. The opening of the exterior body that exposes the detection surface of the temperature/humidity sensor is thus generally provided with a waterproof moisture-permeable cover that allows moisture to pass therethrough while preventing entering of water droplets.

PATENT LITERATURE

PTL 1: International Publication No. 2019/155732

In a conventional sensor device, however, an exterior body is provided with an opening that is larger than a detection surface of a temperature/humidity sensor, and the opening is provided with a waterproof moisture-permeable cover. Thus, it is necessary to use a large-sized waterproof moisture-permeable cover. Therefore, the costs of the entirety of the sensor device are increased due to the high-cost waterproof moisture-permeable cover.

In addition, since the waterproof moisture-permeable cover is constituted by a hard material, a region in which flexibility is impaired is increased in a flexible sensor device when a large-sized waterproof moisture-permeable cover is used.

SUMMARY

One or more embodiments of the present invention have been made in consideration of such circumstances, and one or more embodiments of the present invention provide a sensor device that exerts favorable flexibility over the entirety of the device and that can be manufactured at low costs.

One or more embodiments of the present invention provide the following means.

A sensor device in one or more embodiments of the present invention is a sensor device having flexibility and including a flexible substrate, a temperature/humidity sensor that is connected to the flexible substrate, and an exterior body that is formed of a soft material. The temperature/humidity sensor has a waterproof moisture-permeable material that covers a detection surface. The exterior body has an opening that exposes the waterproof moisture-permeable material. The flexible substrate is bonded at at least a peripheral part of the flexible substrate to the exterior body.

In one or more embodiments of the present invention, the temperature/humidity sensor may be disposed such that an exposed surface of the waterproof moisture-permeable material is at a position closer than a central position in a thickness direction of the sensor device to one surface.

In one or more embodiments of the present invention, a gap between a surface edge portion of the opening of the exterior body and the exposed surface of the waterproof moisture-permeable material may be in a range of 5 mm or less.

In one or more embodiments of the present invention, the flexible substrate may have a bent region, a first region that is provided at one side with the bent region as a boundary, and a second region that is provided at another side, the second region may be disposed at a position closer than the first region to the opening of the exterior body, and the temperature/humidity sensor may be disposed at the second region of the flexible substrate.

One or more embodiments of the present invention may further include an illuminance sensor that is provided at the second region.

In one or more embodiments of the present invention, a battery that supplies electric power to the temperature/humidity sensor may be provided at the first region.

In one or more embodiments of the present invention, the flexible substrate may be constituted by a first substrate and a second substrate that are electrically connected to each other, the second substrate may be disposed at a position closer than the first substrate to the opening of the exterior body, the temperature/humidity sensor may be disposed at the second substrate, and a spacer member may be provided at a surface of the second substrate opposite to a surface of the second substrate facing the opening of the exterior body.

One or more embodiments of the present invention may further include an illuminance sensor that is provided at the second substrate.

In one or more embodiments of the present invention, a battery that supplies electric power to the temperature/humidity sensor may be provided at the first substrate.

According to one or more embodiments of the present invention, it is possible to provide a sensor device that exerts favorable flexibility over the entirety of the device and that can be manufactured at low costs.

DETAILED DESCRIPTION OF THE EMBODIMENTS

Hereinafter, a sensor device as one or more embodiments to which the present invention is applied will be described with reference to the drawings. Each of the following embodiments is described specifically for better understanding of the gist of the invention and is not intended to limit one or more embodiments of the present invention unless otherwise specified. In addition, in the drawings used in the following description, there are cases where principal parts are illustrated in an enlarged manner for convenience of easy understanding of the features of one or more embodiments of the present invention. The dimensional ratios and the like of constituent elements are thus not necessarily the same as the actual ones.

First Embodiment

A sensor device in a first embodiment of the present invention will be described.

Figure 1:
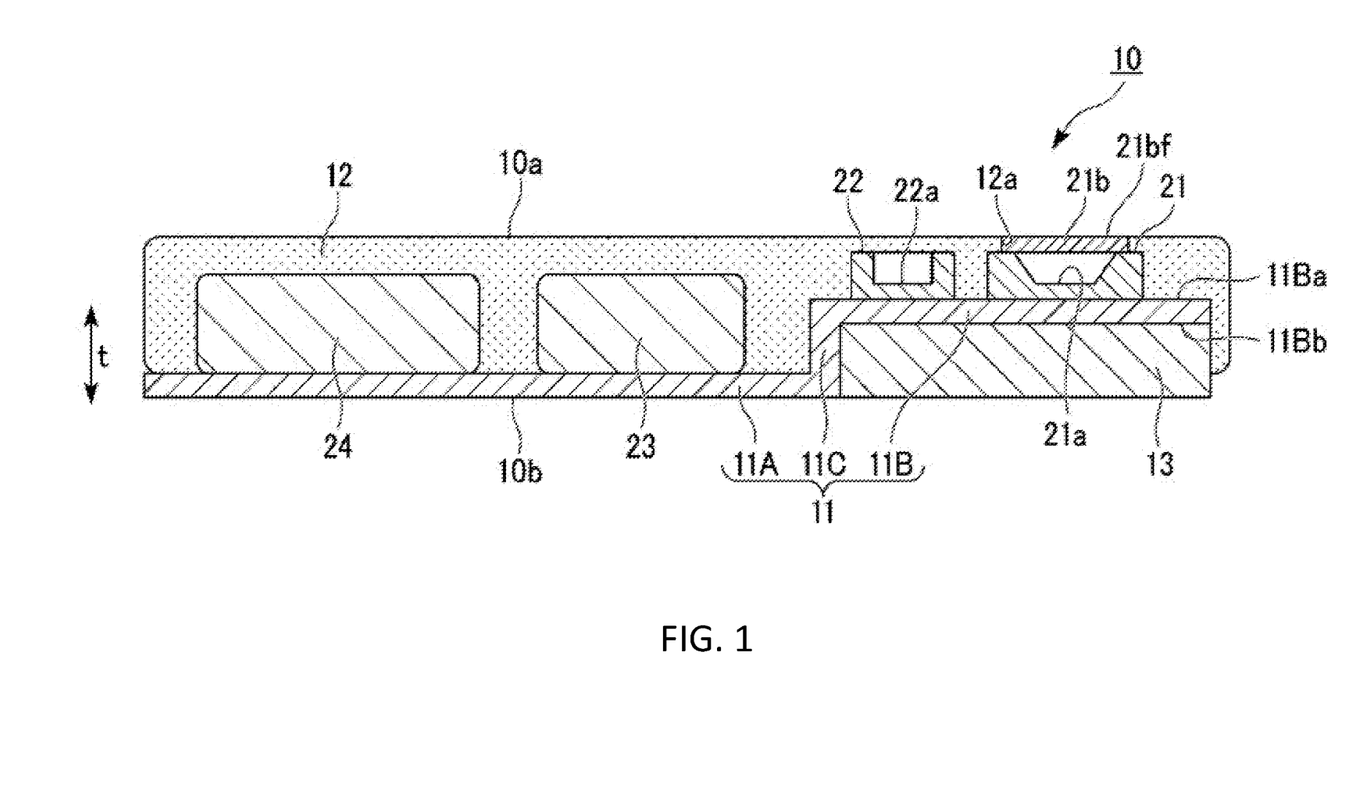
FIG. 1 is a schematic sectional view illustrating one example of a configuration of a sensor device according to a first embodiment of the present invention.
Figure 2:
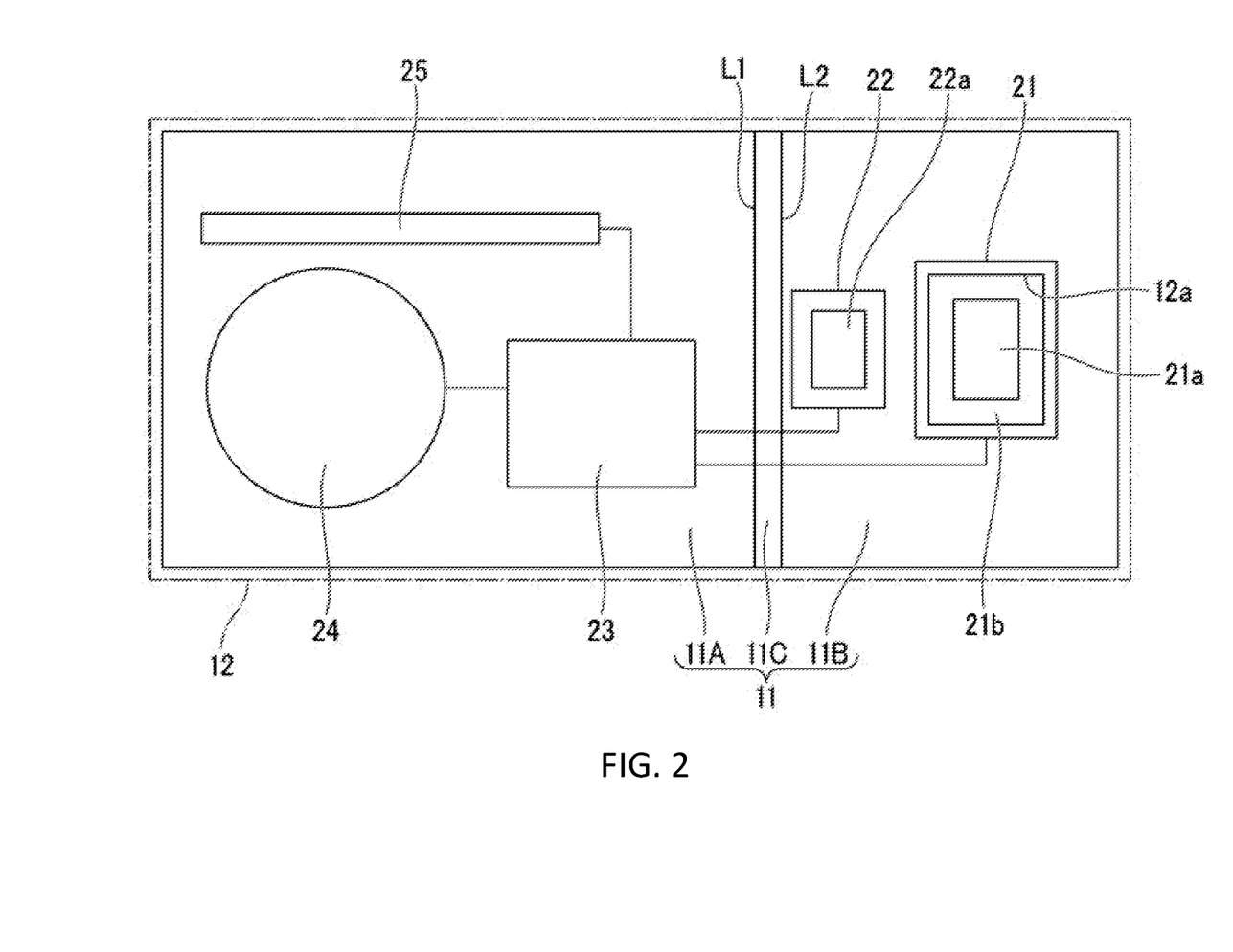
FIG. 2 is a plan view of the sensor device in FIG. 1.

FIG. 1 is a schematic sectional view illustrating one example of a configuration of the sensor device according to the first embodiment of the present invention, and FIG. 2 is a plan view of the sensor device in FIG. 1.

As illustrated in FIG. 1 and FIG. 2, a sensor device 10 includes a flexible substrate 11, a temperature/humidity sensor 21, an illuminance sensor 22, a controller 23, a battery 24, an antenna 25, and an exterior body 12.

The flexible substrate 11 in the present embodiment is a substrate (flexible substrate) having flexibility.

Such a flexible substrate 11 having flexibility may be a substrate that is constituted by a base material in which a thin soft base film having insulation properties and a conductive metal such as copper foil are bonded together, and an electric circuit formed on the base material. For example, the flexible substrate 11 can be produced by forming wiring on a base film, such as a PET film, a PEN film, or a polyimide film, by printing of conductive ink.

The flexible substrate 11 is bent at a bent portion 11C (bent region) that is an intermediate portion in the longitudinal direction into a crank shape. In the following description, one side of the flexible substrate 11 with the bent portion 11C as a boundary is referred to as a first region 11A, and the other side thereof is referred to as a second region 11B.

The flexible substrate 11 is bent at a first bending line L1 in a thickness direction t of the sensor device 10 from the first region 11A extending along a bottom surface 10b of the sensor device 10 and is further bent at a second bending line L2 in the vicinity of the center of the sensor device 10 in the thickness direction t so as to extend parallel to a surface 10a of the sensor device 10, thereby forming the second region 11B.

The first region 11A of the flexible substrate 11 constitutes a portion of the bottom surface 10b that is to be bonded to a wall surface or the like to which the sensor device 10 is attached. The second region 11B of the flexible substrate 11 is disposed at a position closer than the first region 11A to the surface 10a of the sensor device 10.

The controller 23, the battery 24, and the antenna 25 are provided at the first region 11A of the flexible substrate 11. Meanwhile, the temperature/humidity sensor 21 and the illuminance sensor 22 are provided at the second region 11B of the flexible substrate 11.

The temperature/humidity sensor 21 detects temperature and humidity at a detection surface 21a and has a waterproof moisture-permeable material 21b that covers the detection surface 21a. The waterproof moisture-permeable material 21b is, for example, bonded to the temperature/humidity sensor 21 via an adhesive layer and the like. In addition, the waterproof moisture-permeable material 21b is bonded directly to the exterior body 12 by insert-molding or the like or bonded thereto via an adhesive layer and the like. The waterproof moisture-permeable material 21b is a functional material that exerts waterproofness in a direction from one surface side to the other surface side and exerts permeability to water vapor. The waterproof moisture-permeable material may be in a form of fabric or may be in a form of membrane (form of film). In addition, the waterproof moisture-permeable material may be constituted by a plurality of layers.

The illuminance sensor 22 detects the amount of light that is incident on a detection surface 22a. As the temperature/humidity sensor 21 and the illuminance sensor 22, commercially available thin sensor chips are usable as long as the sensor chips are sensors of types mountable on an IC chip.

The controller 23 outputs (transmits) information signals of temperature, humidity, and illuminance from the antenna 25 on the basis of a temperature signal, a humidity signal, and an illuminance signal that are input from the temperature/humidity sensor 21 and the illuminance sensor 22. The information signal that is output from the antenna 25 may be a signal that meets the LPWA standard capable of covering a wide area with low power consumption. An example of a communication protocol is a LoRa method: Chirp Spread Spectrum modulation.

The material and the shape of the antenna 25, and the method of manufacturing the antenna 25 are not limited as long as the antenna 25 is configured to wirelessly transmit signals that are from the temperature/humidity sensor 21 and the illuminance sensor 22 and belongs to a thin, planar, small, or micro antenna.

On the battery 24, a solar battery is not mounted, and a primary battery is mounted as an internal power source. As the primary battery, an inexpensive primary battery distributed in the market is preferable, and a coin-type primary battery is suitably usable. On the sensor device 10, a solar battery is not mounted, and only a primary battery is mounted as an internal power source to ensure the flexibility of the entirety of the sensor device 10. Consequently, compared with a sensor device constituted by a resin case as a housing and a printed circuit board and a sensor device on which a solar battery is mounted, the costs for manufacturing the sensor device 10 can be significantly reduced. In addition, there is no problem in operation in a state without a light source, for example, during night. The battery 24, however, may be constituted by a secondary battery depending on the applications and the specifications thereof.

The exterior body 12 is bonded to at least a peripheral part of the flexible substrate 11 and is formed so as to cover the temperature/humidity sensor 21, the illuminance sensor 22, the controller 23, the battery 24, and the antenna 25 that are disposed at the flexible substrate 11. The exterior body 12 is bonded to the flexible substrate 11 by, for example, insert-molding or the like. In the present embodiment, by bonding a peripheral part of the exterior body 12 to the flexible substrate 11 and a spacer member 13, the waterproofness of the inside of the sensor device 10 is ensured.

At the exterior body 12, an opening 12a that exposes the waterproof moisture-permeable material 21b constituting the temperature/humidity sensor 21 is formed. Such an opening 12a may be, for example, an opening of a size that exposes the entire surface of the waterproof moisture-permeable material 21b or a region of the surface excluding a peripheral part. The shape of the opening 12a is not particularly limited and may be various shapes including a circular shape, a polygonal shape, and the like in plan view.

Such an exterior body 12 is formed of a soft material having softness at least at a room temperature so as to be capable of following the deformation of the flexible substrate 11. Examples of the soft material are rubber materials, such as silicone rubber and acrylic rubber, and various types of resins, such as foamed materials of foamed urethane resin and the like, but are not particularly limited. The exterior body 12 may be formed of a light-transmitting material, for example, a transparent rubber material or a transparent resin. By using such a transparent rubber material or a transparent resin in the exterior body 12, it is possible to cause light to be incident on the illuminance sensor 22 even when the detection surface 22a of the illuminance sensor 22 is covered by the exterior body 12.

In the present embodiment, the temperature/humidity sensor 21 is disposed such that an exposed surface 21bf of the waterproof moisture-permeable material 21b constituting the temperature/humidity sensor 21 is at a position closer than the central position in the thickness direction t of the sensor device 10 to the surface 10a that is one surface. More specifically, the temperature/humidity sensor 21 is disposed such that the exposed surface 21bf of the waterproof moisture-permeable material 21b is at the same position as the position of the surface 10a of the sensor device 10 or is in the vicinity of the surface 10a.

Figure 3:
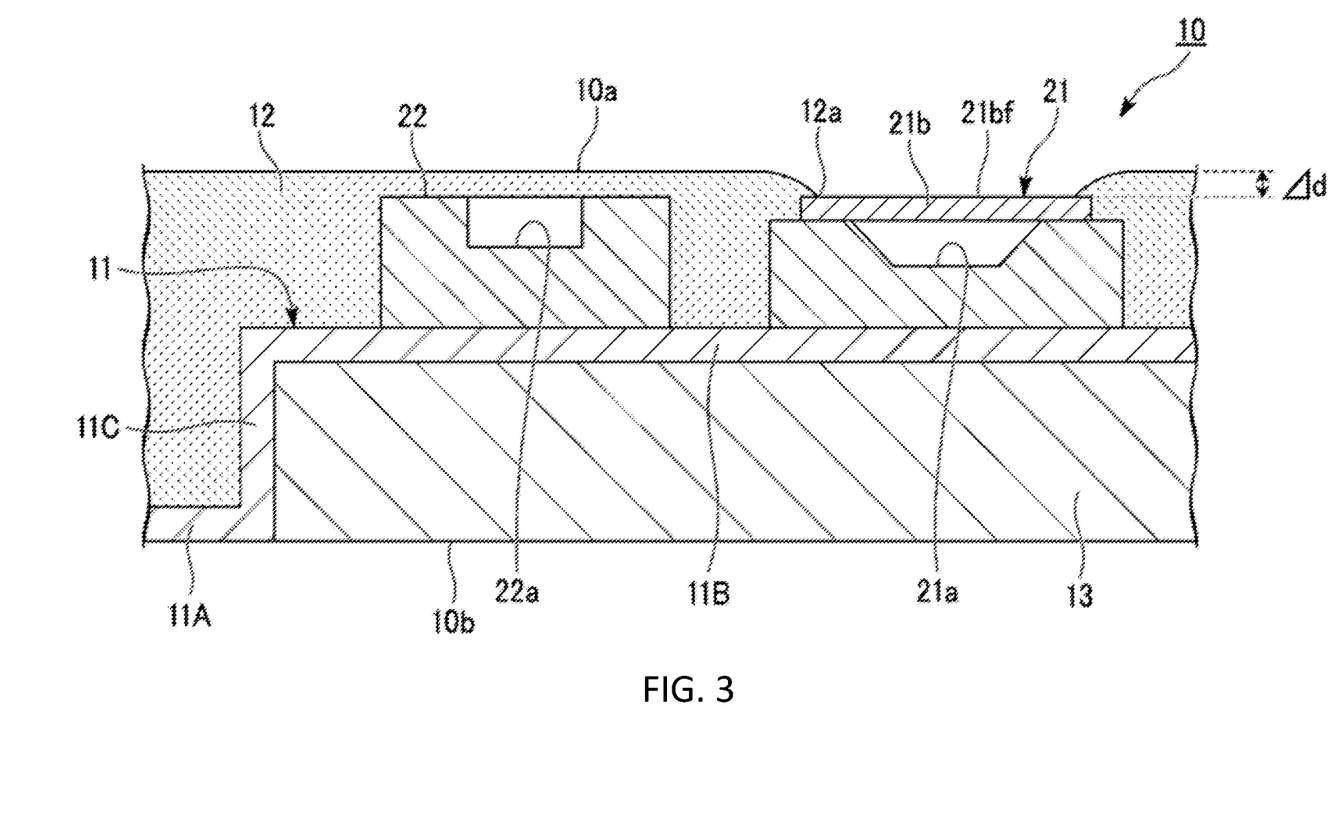
FIG. 3 is a principal-part enlarged sectional view illustrating a temperature/humidity sensor of the sensor device in FIG. 1 and the periphery thereof.

In one example, as illustrated in the enlarged sectional view of FIG. 3, the temperature/humidity sensor 21 may be disposed at the second region 11b of the flexible substrate 11 such that a gap Δd between a surface edge portion of the opening 12a of the exterior body 12 and the exposed surface 21bf of the waterproof moisture-permeable material 21b is in a range of 5 mm or less.

As described above, the waterproof moisture-permeable material 21b constituting the temperature/humidity sensor 21 is disposed so as to be at the same position as the position of the surface 10a of the sensor device 10 or be in the vicinity thereof, and the second region 11B of the flexible substrate 11 is disposed at a position closer than the first region 11A to the opening 12a of the exterior body 12 in the thickness direction t. A step generated between the first region 11A and the second region 11B is compensated with the spacer member 13. The spacer member 13 supports the second region 11B of the flexible substrate 11.

The spacer member 13 is provided at a face 11Bb of the second region 11B opposite to a face 11Ba of the second region 11B facing the opening 12a of the exterior body 12. The spacer member 13 is formed of, for example, a film or the like made of a PET resin having flexibility. In the present embodiment, the spacer member 13 has a solid structure without cavities in the inside thereof. It is thus possible to maintain the strength of the spacer member 13 to be high.

According to the sensor device 10 in the present embodiment having the above configuration, the temperature/humidity sensor 21 having the waterproof moisture-permeable material 21b of a small size that covers the detection surface 21a is used, and the exterior body 12 is provided with an opening that exposes the waterproof moisture-permeable material 21b. Therefore, compared with a structure in which, as with a conventional sensor device, a side surface or the like of an exterior body is provided with a large opening and in which a waterproof moisture-permeable cover is stuck to the opening from the outer side, the size of the waterproof moisture-permeable material 21b can be reduced remarkably. It is thus possible to reduce the costs relating to the expensive waterproof moisture-permeable material and possible to manufacture the sensor device 10 at low costs.

In addition, as with the present embodiment, by using the temperature/humidity sensor 21 including the small-sized waterproof moisture-permeable material 21b, there is less likelihood of the waterproof moisture-permeable material, which is a hard material, decreasing the flexibility of the sensor device 10, compared with a configuration in which, as with the related art, an exterior body is provided with a large-sized waterproof moisture-permeable material. It is thus possible to provide the sensor device 10 having favorable flexibility over the entirety of the device.

In addition, as with the present embodiment, by bending the flexible substrate 11 into a crank shape by the bent portion 11C, forming the second region 11B at a position closer than the first region 11A to the surface 10a of the sensor device 10, and disposing the temperature/humidity sensor 21 at the second region 11B, it is possible to raise the temperature/humidity sensor 21 to a position close to the surface 10a of the sensor device 10. It is thus possible to expose the detection surface 21a of the temperature/humidity sensor 21 sufficiently to the outside air through the waterproof moisture-permeable material 21b, even when the size of the opening 12a formed at the exterior body 12 is reduced to expose the waterproof moisture-permeable material 21b of the temperature/humidity sensor 21, and possible to achieve both maintaining of the design by reducing the diameter of the opening 12a and precise measurement of temperature and humidity.

Further, when the temperature/humidity sensor 21 is included together with the illuminance sensor 22, as with the present embodiment, by disposing both the temperature/humidity sensor 21 and the illuminance sensor 22 at the second region 11B of the flexible substrate 11, the temperature/humidity sensor 21 and the illuminance sensor 22 are disposed adjacent and close to each other. It is thus possible to improve the design by reducing the size of the opening, compared with a sensor device in the related art in which a temperature/humidity sensor and an illuminance sensor are disposed to be away from each other.

It is preferable that an adhesive layer (not illustrated) for sticking the sensor device 10 to a structure or the like be provided on the side of the bottom surface 10b of the sensor device 10 in the present embodiment. As the adhesive layer, a commercially available industrial double-sided adhesive tape is usable. A re-peelable industrial double-sided adhesive tape may be used. The surfaces of the adhesive layer on both sides may be re-peelable adhesive surfaces. It is particularly preferable to use an industrial double-sided adhesive tape of a one-side re-peelable type in which a surface on the side of the bottom surface 10b of the sensor device 10 is a general-purpose adhesive surface and in which a surface on the other side is a re-peelable adhesive surface.

As the commercially available industrial double-sided adhesive tape, for example, a DAITAC (registered trademark) industrial double-sided adhesive tape, manufactured by DIC Corporation, is usable. Examples of the industrial double-sided adhesive tape of the one-side re-peelable type are DAITAC (registered trademark) industrial double-sided adhesive tapes, manufactured by DIC Corporation, having the product numbers of "#8800DR", "#8612DFT", "#8616DJ-50", "#8616DJ black(N)", and the like.

On the side of the surface 10a of the sensor device 10, a decoration layer formed of a light-shielding rubber sheet or the like may be further formed to improve the design. In this case, openings may be provided at parts that overlap the temperature/humidity sensor 21 and the illuminance sensor 22.

Second Embodiment

A sensor device in a second embodiment of the present invention will be described.

Figure 4:
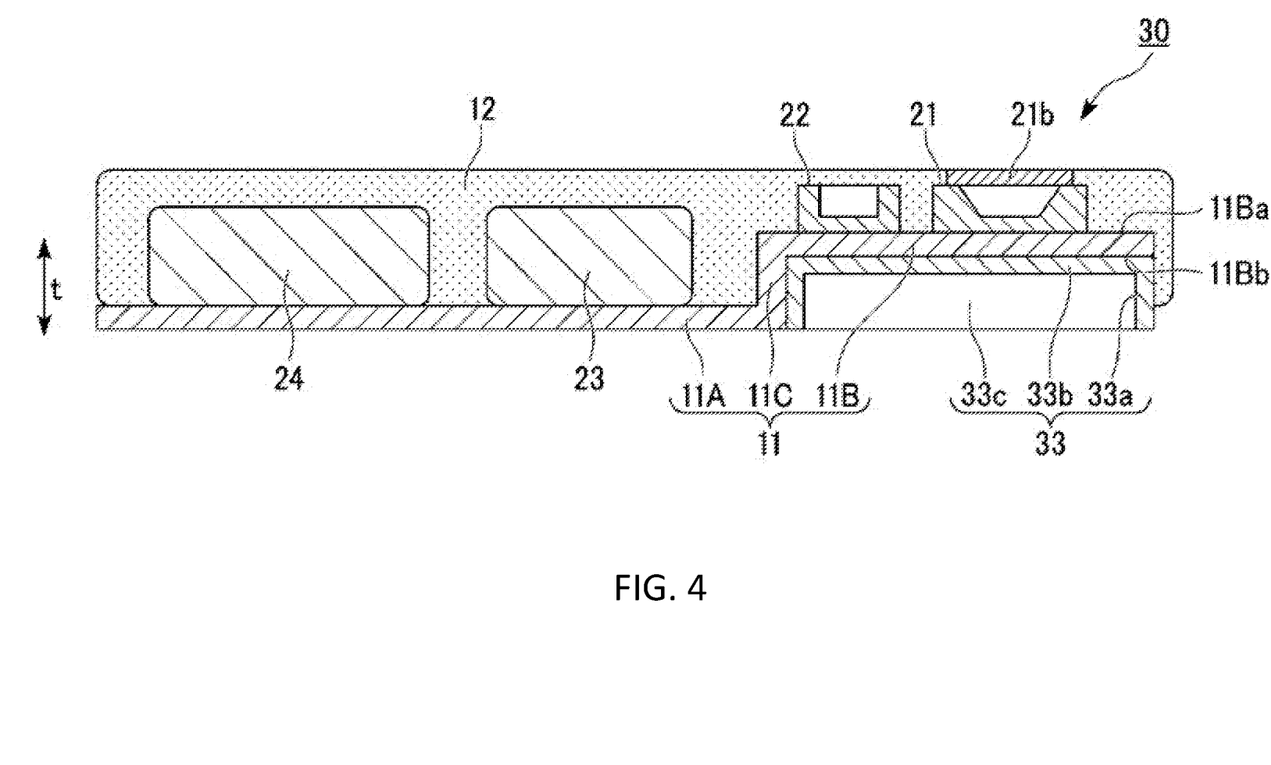
FIG. 4 is a schematic sectional view illustrating one example of a configuration of a sensor device according to a second embodiment of the present invention.

FIG. 4 is a schematic sectional view illustrating one example of a configuration of the sensor device according to the second embodiment of the present invention. In the following description, the same configurations as those in the above-described first embodiment are given identical numerals, and duplicate description thereof is omitted.

As illustrated in FIG. 4, in a sensor device 30, a spacer member 33 that compensates a step between the second region 11B and the first region 11A of the flexible substrate 11 has a box structure constituted by a peripheral part 33a and an upper surface part 33b. In other words, the spacer member 33 has a space portion 33c that is defined by the peripheral part 33a and the upper surface part 33b. The spacer member 33 may have a hollow structure having a space portion in the inside thereof.

By providing the spacer member 33 with the space portion 33c, the upper surface part 33b can be thermally insulated in the thickness direction t. In addition, the weight of the spacer member 33 can be reduced. It is thus possible to improve the measurement accuracy, reduce the weight, and further improve the flexibility in the sensor device 30.

Third Embodiment

A sensor device in a third embodiment of the present invention will be described.

Figure 5:
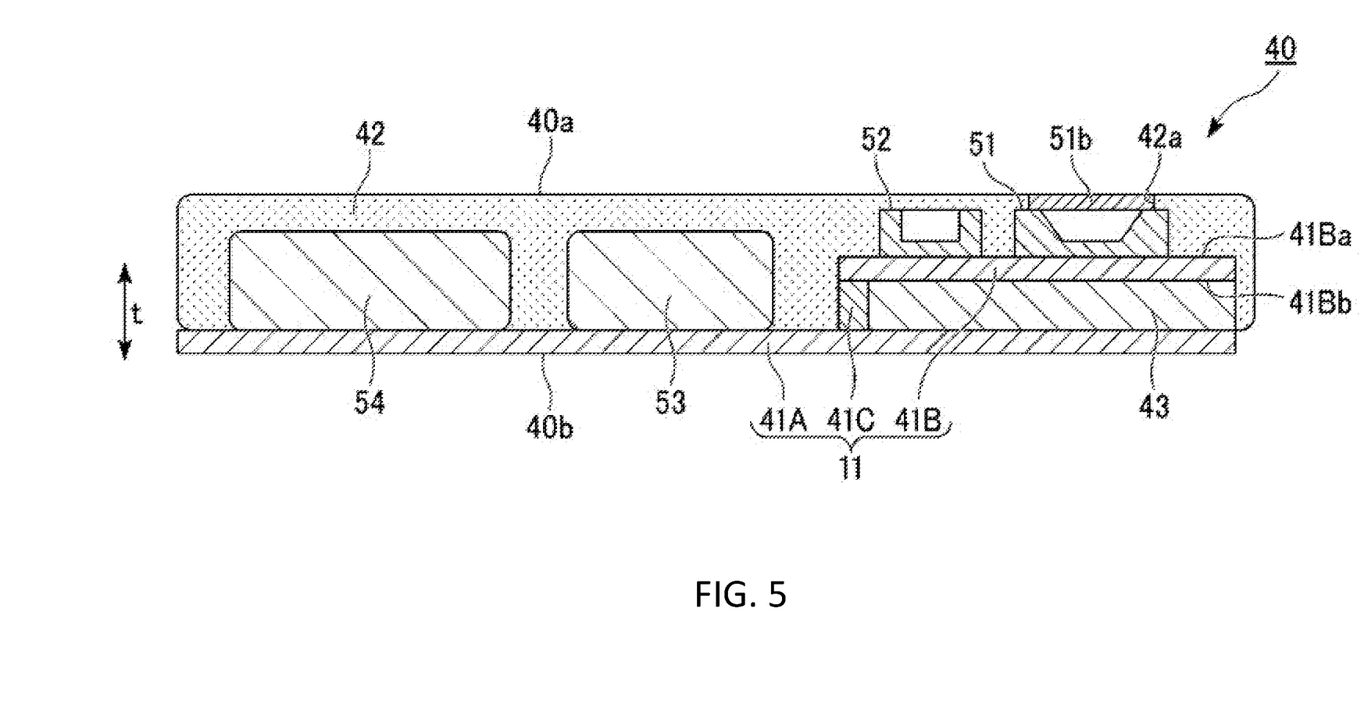
FIG. 5 is a schematic sectional view illustrating one example of a configuration of a sensor device according to a third embodiment of the present invention.

FIG. 5 is a schematic sectional view illustrating one example of a configuration of the sensor device according to the third embodiment of the present invention. In the following description, the same configurations as those in the above-described first embodiment are given identical numerals, and duplicate description thereof is omitted.

As illustrated in FIG. 5, in a sensor device 40, a flexible substrate 41 is constituted by the two substrates of a first substrate 41A and a second substrate 41B.

The first substrate 41A constituting the flexible substrate 41 is formed along a bottom surface 40b of the sensor device 40. The second substrate 41B constituting the flexible substrate 41 is formed so as to overlap a portion of the first substrate 41A in the thickness direction t, to be spaced from the first substrate 41A in the thickness direction t, and to be closer than the first substrate 41A to a surface 40a of the sensor device 40.

In addition, a connection portion 41C that electrically connects the first substrate 41A and the second substrate 41B to each other is formed between a portion in the vicinity of the center of the first substrate 41A and an end portion of the second substrate 41B. A spacer member 43 is formed between the first substrate 41A and the second substrate 41B that are spaced from each other in the thickness direction t.

The spacer member 43 is provided at a face 41Bb of the second substrate 41B opposite to a face 41Ba of the second substrate 41B facing an opening 42a of an exterior body 42. Such a spacer member 43 supports the second substrate 41B such that the second substrate 41B is closer than the first substrate 41A to the surface 40a of the sensor device 40.

In the present embodiment, a controller 53, a battery 54, and an antenna (not illustrated) are disposed at the first substrate 41A. In addition, a temperature/humidity sensor 51 and an illuminance sensor 52 are disposed adjacent to each other at the second substrate 41B.

By thus disposing the temperature/humidity sensor 51 and the illuminance sensor 52 at the second substrate 41B that is provided closer than the first substrate 41A to the surface 40a of the sensor device 40, it is possible to dispose the temperature/humidity sensor 51 and the illuminance sensor 52 on the side of the surface 40a of the sensor device 40.

The exterior body 42 is bonded to a peripheral part of the flexible substrate 41 and an end portion of the spacer member 43 and is formed so as to cover the temperature/humidity sensor 51, the illuminance sensor 52, the controller 53, the battery 54, and the antenna (not illustrated) that are disposed at the flexible substrate 41. Also in the present embodiment, by bonding a peripheral part of the exterior body 42 to the peripheral part of the flexible substrate 41 and to the end portion of the spacer member 43, the waterproofness in the inside of the sensor device 40 is ensured.

The opening 42a that exposes a waterproof moisture-permeable material 51b constituting the temperature/humidity sensor 51 is formed at the exterior body 42. Such an opening 42a may be, for example, an opening of a size that exposes the entire surface of the waterproof moisture-permeable material 51b or a region of the surface excluding a peripheral part. The shape of the opening 42a is not particularly limited and may be various shapes including a circular shape, a polygonal shape, and the like in plan view.

Such an exterior body 42 is formed of a soft material having softness at least at a room temperature so as to be capable of following the deformation of the flexible substrate 41. Examples of the soft material are rubber materials, such as silicone rubber, and various types of resins, such as an epoxy resin, but are not particularly limited. The exterior body 42 may be formed of a light-transmitting material, for example, a transparent rubber material or a transparent resin.

In such a sensor device in the third embodiment, the flexible substrate 41 is not provided with a bent portion and is constituted by the two substrates of the first substrate 41A and the second substrate 41B, and the second substrate 41B is disposed to be spaced from the first substrate 41A and to be closer than the first substrate 41A to the surface 40a of the sensor device 40. Consequently, processing of bending the flexible substrate 41 is not necessary in the manufacture of the sensor device 40. It is thus possible to manufacture the sensor device 40 at lower costs.

While some embodiments of the present invention have been described above, these embodiments are presented as examples and are not intended to limit the scope of one or more embodiments of the present invention. These embodiments can be implemented in the other various forms, and various omissions, replacements, and changes can be performed in these embodiments within a range that does not depart from the spirit of the invention. The embodiments and modifications thereof are included in the scope and the gist of the invention and also included in the invention disclosed in the claims and the scope equivalent thereto.

For example, in each of the embodiments described above, a configuration in which the temperature/humidity sensor and the illuminance sensor are included as sensors is presented as an example. One or more embodiments of the present invention, however, may have a configuration without the illuminance sensor as long as one or more embodiments of the present invention include at least the temperature/humidity sensor. In this case, it is not necessary to use a light-transmitting (transparent) material in the exterior body. For example, a flexible and light-transmitting material such as black rubber is also usable as the exterior body. In addition, any functional sensors other than the illuminance sensor may be included.

Further, for example, in each of the embodiments described above, a configuration in which the temperature/humidity sensor and the illuminance sensor are provided at the second region or the second substrate that constitutes the flexible substrate and in which the battery, the controller, and the antenna are provided at the first region or the first substrate that constitutes the flexible substrate is presented as an example. However, it is sufficient that at least the temperature/humidity sensor be disposed at the second region or the second substrate of the flexible substrate that is present at a position closer to the surface of the sensor device. One or a plurality of any other members (the controller, the battery, the antenna, and the like) may be provided at the second region or the second substrate that constitutes the flexible substrate. The arrangement layout of these members are not limited.

In each of the embodiment described above, the flexible substrate 11 is bent in a crank shape in a sectional view (for example, FIG. 1). The flexible substrate 11 is, however, not limited thereto and may be bent in a U-shape in a sectional view. In this case, the temperature/humidity sensor and the illuminance sensor (or at least the temperature/humidity sensor) may be provided on one main surface side of the flexible substrate 11 and may be electrically connected via a conductive portion such as a through hole to any other member such as a battery or the like formed on the other main surface side.

In addition, in the flexible substrate 11, the first region 11A and the second region 11B are provided at different heights (levels) in the thickness direction t (for example, FIG. 1). The first region 11A and the second region 11B are, however, not limited thereto and may be provided at the same height in the thickness direction. In other words, the flexible substrate 11 may not have the bent portion, and the first region 11A and the second region 11B may constitute an identical plane or a substantially identical plane. In this case, to suppress heat transmission from an attached surface to which the sensor device 10 is attached, a heat insulating layer constituted by a heat insulating sheet or the like may be provided at a surface of the flexible substrate 11 opposite to a surface thereof at which the temperature/humidity sensor 21 is provided. By thus simply configuring the flexible substrate 11, it is possible to manufacture the sensor device 10 at low costs.

INDUSTRIAL APPLICABILITY

The sensor device in one or more embodiments of the present invention has favorable flexibility and can achieve a low-cost sensor device by reducing costs relating to an expensive waterproof moisture-permeable material. Therefore, for example, an operator at a work site can easily attach and detach the sensor device having flexibility to and from a plurality of portions of a column and the like under construction. Consequently, it is possible to accurately grasp the work environment of the site and possible to manage the health state of the operator by measuring, at an appropriate position near the operator, the temperature and the humidity at the site. Accordingly, it is possible to suitably use the sensor device of one or more embodiments of the present invention at various work sites of construction, building, and the like.

REFERENCE SIGNS LIST 10 sensor device
11 flexible substrate
11A first region
11B second region
11C bent portion
12 exterior body
13 spacer member
21 temperature/humidity sensor
21b waterproof moisture-permeable material
22 illuminance sensor
23 controller
24 battery
25 antenna Although the disclosure has been described with respect to only a limited number of embodiments, those skilled in the art, having benefit of this disclosure, will appreciate that various other embodiments may be devised without departing from the scope of the present disclosure. Accordingly, the scope of the invention should be limited only by the attached claims.

The invention claimed is:

1. A sensor device having flexibility, comprising a flexible substrate, a temperature/humidity sensor that is connected to the flexible substrate, and an exterior body that is formed of a soft material, wherein: the temperature/humidity sensor has a waterproof moisture-permeable material that covers a detection surface, the exterior body has an opening that exposes the waterproof moisture-permeable material, and at least a peripheral part of the flexible substrate is bonded to the exterior body, wherein: the flexible substrate has a bent region, a first region that is provided at one side of the flexible substrate with the bent region as a boundary, and a second region that is provided at the other side of the flexible substrate with the bent region as a boundary the second region is disposed at a position closer to the opening of the exterior body than the first region, and the temperature/humidity sensor is disposed at the second region of the flexible substrate.

2. The sensor device according to claim 1, wherein the temperature/humidity sensor is disposed such that an exposed surface of the waterproof moisture-permeable material is at a position closer to one surface of the sensor device than a central position in a thickness direction of the sensor device.

3. The sensor device according to claim 2, wherein a gap between a surface edge portion of the opening of the exterior body and the exposed surface of the waterproof moisture-permeable material is in a range of 5 mm or less.

4. The sensor device according to claim 1, further comprising an illuminance sensor that is provided at the second region.

5. The sensor device according to claim 1, wherein a battery that supplies electric power to the temperature/humidity sensor is provided at the first region.

6. The sensor device according to claim 1, wherein:
the flexible substrate is constituted by a first substrate and a second substrate that are electrically connected to each other, the second substrate is disposed at a position closer to the opening of the exterior body than the first substrate,
the temperature/humidity sensor is disposed at the second substrate, and
a spacer member is provided at a surface of the second substrate opposite to a surface of the second substrate facing the opening of the exterior body.

7. The sensor device according to claim 6, further comprising an illuminance sensor that is provided at the second substrate.

8. The sensor device according to claim 6, wherein a battery that supplies electric power to the temperature/humidity sensor is provided at the first substrate.

* * * * *